(12) United States Patent
Bedau et al.

(10) Patent No.: US 8,941,196 B2
(45) Date of Patent: Jan. 27, 2015

(54) PRECESSIONAL REVERSAL IN ORTHOGONAL SPIN TRANSFER MAGNETIC RAM DEVICES

(71) Applicant: New York University, New York, NY (US)

(72) Inventors: Daniel Bedau, San Jose, CA (US); Huanlong Liu, New York, NY (US); Andrew David Kent, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 13/935,274

(22) Filed: Jul. 3, 2013

(65) Prior Publication Data

US 2014/0015074 A1   Jan. 16, 2014

Related U.S. Application Data

(60) Provisional application No. 61/669,963, filed on Jul. 10, 2012.

(51) Int. Cl.
*H01L 29/82* (2006.01)
*H01L 43/02* (2006.01)
(Continued)

(52) U.S. Cl.
CPC .............. *H01L 43/02* (2013.01); *H01L 43/08* (2013.01); *G11C 11/16* (2013.01)
USPC ........... 257/421; 257/422; 257/423; 257/424; 257/427; 257/E29.323; 438/3; 365/157; 365/158; 365/171; 365/173

(58) Field of Classification Search
USPC ....................... 257/421–427, E29.323; 438/3; 365/157–158, 171–173; 360/324–326, 360/313
See application file for complete search history.

(56) References Cited

U.S. PATENT DOCUMENTS 6,532,164 B2   3/2003  Redon et al.
6,980,469 B2 *  12/2005  Kent et al. ..................... 365/171
(Continued)

FOREIGN PATENT DOCUMENTS

EP            2278589 A1    1/2011
WO     WO2012/068309 A2    5/2012

OTHER PUBLICATIONS

A.D. Kent et al., Spin-transfer-induced, precessional magnetization reversal, Applied Physics Letters 84, No. 9, pp. 3897-3899 (May 10, 2004).

(Continued)

*Primary Examiner* — Jami M Valentine
(74) *Attorney, Agent, or Firm* — Foley & Lardner LLP

(57) ABSTRACT

Orthogonal spin-torque bit cells whose spin torques from a perpendicular polarizer and an in-plane magnetized reference layer are constructively or destructively combined. An orthogonal spin-torque bit cell includes a perpendicular magnetized polarizing layer configured to provide a first spin-torque; an in-plane magnetized free layer and a reference layer configured to provide a second spin-torque. The first spin-torque and the second spin-torque combine and the combined first spin-torque and second spin-torque influences the magnetic state of the in-plane magnetized free layer. The in-plane magnetized free layer and the reference layer form a magnetic tunnel junction. The first spin-torque and second spin-torque can combine constructively to lower a switching current, increase a switching speed, and/or torque decrease an operating energy of the orthogonal spin-torque bit cell.

20 Claims, 10 Drawing Sheets

(51) Int. Cl.
*H01L 43/08* (2006.01)
*G11C 11/16* (2006.01)

(56) References Cited

U.S. PATENT DOCUMENTS

| | | | |
|---|---|---|---|
| 7,170,778 B2 | 1/2007 | Kent et al. | |
| 7,307,876 B2 | 12/2007 | Kent et al. | |
| 7,573,737 B2 | 8/2009 | Kent et al. | |
| 7,911,832 B2 | 3/2011 | Kent et al. | |
| 8,363,465 B2 | 1/2013 | Kent et al. | |
| 2001/0007560 A1* | 7/2001 | Masuda et al. | 370/401 |
| 2008/0268291 A1* | 10/2008 | Akiyama et al. | 428/812 |
| 2009/0073756 A1* | 3/2009 | Yang | 365/171 |
| 2009/0316303 A1* | 12/2009 | Yamada et al. | 360/234.3 |
| 2010/0134923 A1* | 6/2010 | Clinton et al. | 360/131 |
| 2014/0119106 A1* | 5/2014 | Lee et al. | 365/158 |

OTHER PUBLICATIONS

H. Liu, et al., "Precessional Reversal in Orthogonal Spin Transfer Magnetic Random Access Memory Devices", pp. 1-9, (May 6, 2012).

J. Katine and E.E. Fullerton, "Device Implications of Spin-Transfer Torques", Journal of Magnetism and Magnetic Material 320, pp. 1217-1226 (2008).

J.S. Slonczewski, "Current-Driven Excitation of Magnetic Multilayers", Journal of Magnetism and Magnetic Materials 159, pp. L1-L7, (1996).

R.H. Koch et al., "Time-Resolved Reversal of Spin-Transfer Switching in a Nanomagnet", Phyiscal Review Letters, vol. 92, No. 8, pp. 088302-1 to 088302-4, (2004).

T., Devolder et al., "Single-Shot Time-Resolved Measurements of Nanosecond-Scale Spin-Transfer Induced Switching: Stochastic Versus Deterministic Aspects", Physical Review Letters, PRL 100, 0, 057206, pp. 057206-1 to 057206-4 (2008).

Y.T. Gui, et al., Single-Shot Time-Domain Studies of Spin-Torque-Driven Switching in Magnetic Tunnel Junctions, Physical Review Letters, PRL 104, pp. 097201-1 to 097201-4 (2010).

Xiaobin, Wang et al., Spintronic Memristor Devices and Application. Design, Automation & Test in Europe Conference & Exhibition (2010), pp. 667-672.

Marins de Castro, M., et al., Sub-nanosecond Precessional Switching in a MRAM Cell with a Perpendicular Polarizer, May 2012, pp. 20-23.

Liu, H. et al., Ultrafast switching in a magnetic tunnel junction based orthogonal spin transfer devices., Appl. Phys. Lett. 97, 242510-1 to 242510-3, (2010).

Notification of Transmittal of the International Search Report and the Written Opinion of the International Searching Authority, or the Declaration for PCT/US2013/049556, dated Oct. 31, 2013, 7 pages.

* cited by examiner

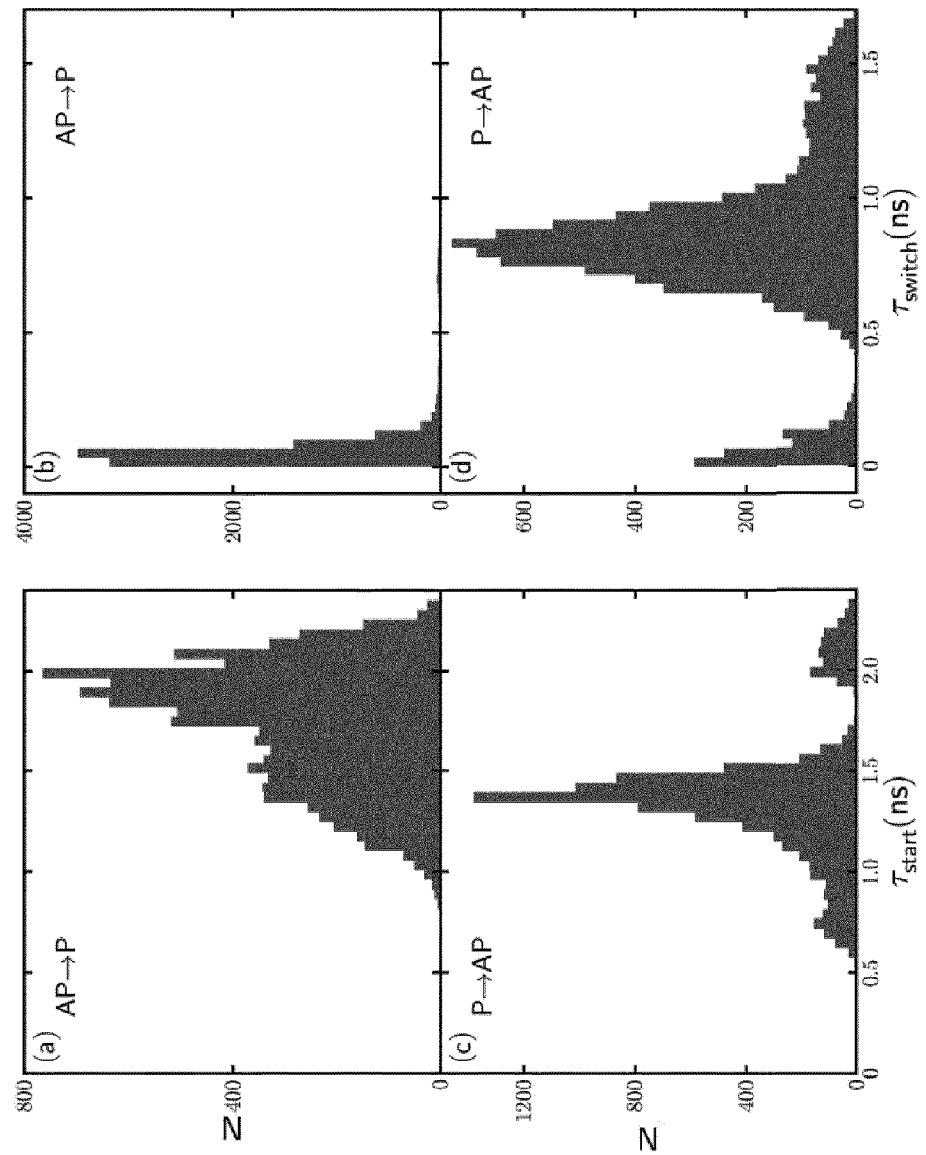

PRECESSIONAL REVERSAL IN ORTHOGONAL SPIN TRANSFER MAGNETIC RAM DEVICES

CROSS-REFERENCE TO RELATED PATENT APPLICATIONS

This application claims priority to U.S. Provisional Application No. 61/669,963, filed Jul. 10, 2012 and is incorporated herein by reference in its entirety.

BACKGROUND

In general, spin-transfer torque (STT) magnetic random access memory (MRAM) devices hold great promise as a universal memory since they can be fast, nonvolatile, small in size and operate with low energy consumption. Common collinear STT-MRAM devices have relatively long mean switching times (several nanoseconds) and broad switching time distributions due to the small spin-torques in their initial (collinear) magnetization configurations. Reducing switching times, lowering switching current, and lowering operating energy of RAM can improve the performance of the memory.

SUMMARY

In general, one aspect of the subject matter described in this specification can be embodied in orthogonal spin-torque bit cells whose spin torques from a perpendicular polarizer and an in-plane magnetized reference layer are constructively or destructively combined. An orthogonal spin-torque bit cell includes a perpendicular magnetized polarizing layer configured to provide a first spin-torque; an in-plane magnetized free layer and a reference layer configured to provide a second spin-torque. The first spin-torque and the second spin-torque combine and the combined first spin-torque and second spin-torque influences the magnetic state of the in-plane magnetized free layer. The in-plane magnetized free layer and the reference layer form a magnetic tunnel junction. The first spin-torque and second spin-torque can combine constructively to lower a switching current, increase a switching speed, and/or decrease an operating energy of the orthogonal spin-torque bit cell. Other implementations of orthogonal spin-torque bit cells/memory are described in greater detail below.

The foregoing summary is illustrative only and is not intended to be in any way limiting. In addition to the illustrative aspects, implementations, and features described above, further aspects, implementations, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

FIG. 5A illustrates histograms for a switching start time in accordance with an illustrative implementation.

FIG. 5B illustrates histograms for a switching time in accordance with an illustrative implementation.

Figure 1A:
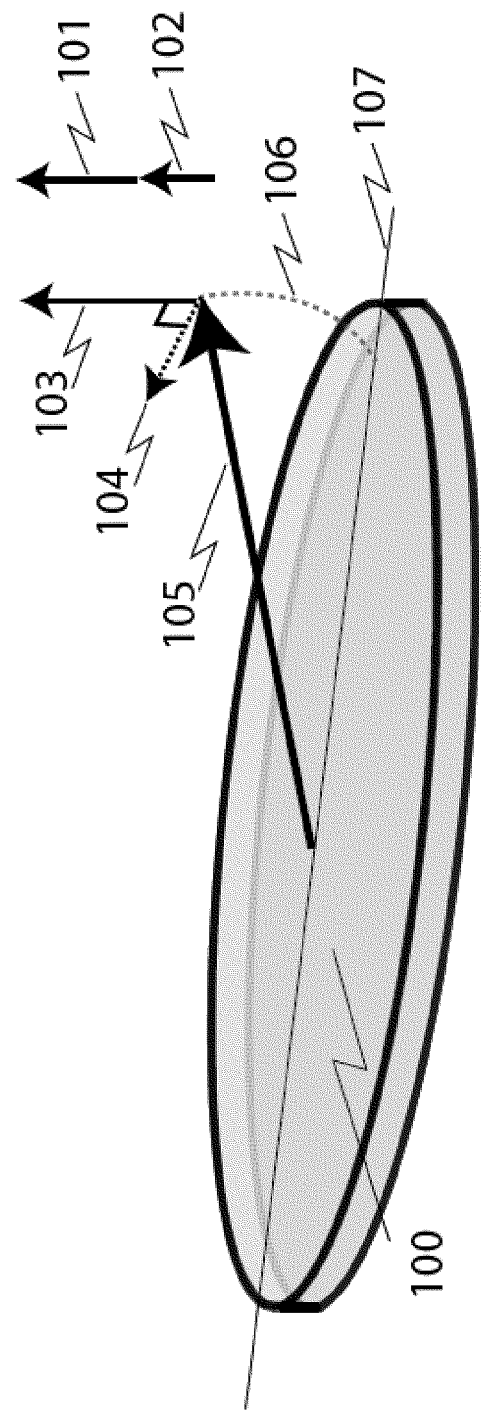
FIGS. 1A and 1B illustrate spin transfer torques acting on a free layer magnetization in accordance with an illustrative implementation.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Orthogonal spin transfer magnetic random access memory devices are of great interest for both applications and fundamental physics. Orthogonal spin transfer MRAM devices offer reliable and fast switching, with experimentally demonstrated switching times of 500 picoseconds (ps). One advantage of orthogonal spin transfer MRAM devices is associated with their structure, which employs a spin-polarizing layer magnetized in a direction orthogonal to the switchable free layer. The STT is nearly maximum in such a configuration, while it is zero when the polarizing layer is aligned with the magnetization of the free layer. Therefore, instead of waiting for thermal initiation, which can take up to tens of nanoseconds in a collinear device, the perpendicular polarizer in the orthogonal spin transfer MRAM device provides a large STT to initiate the magnetization switching from the instant a device is energized. The switching process in the orthogonal spin transfer MRAM devices is also distinct from that of collinearly magnetized STT-MRAM devices. As the polarizer is magnetized perpendicular to the plane, there is an out-of-plane STT acting on the free layer, which is magnetized in-plane and has an easy plane magnetic anisotropy. This STT can be sufficiently large that the free layer magnetization can be tilted out of film plane, creating a large demagnetization field normal to the film plane. The free layer magnetization will then precess about the normal to the plane. This type of precessional magnetizations dynamics is unique to orthogonal spin transfer MRAM devices.

Figure 1B:
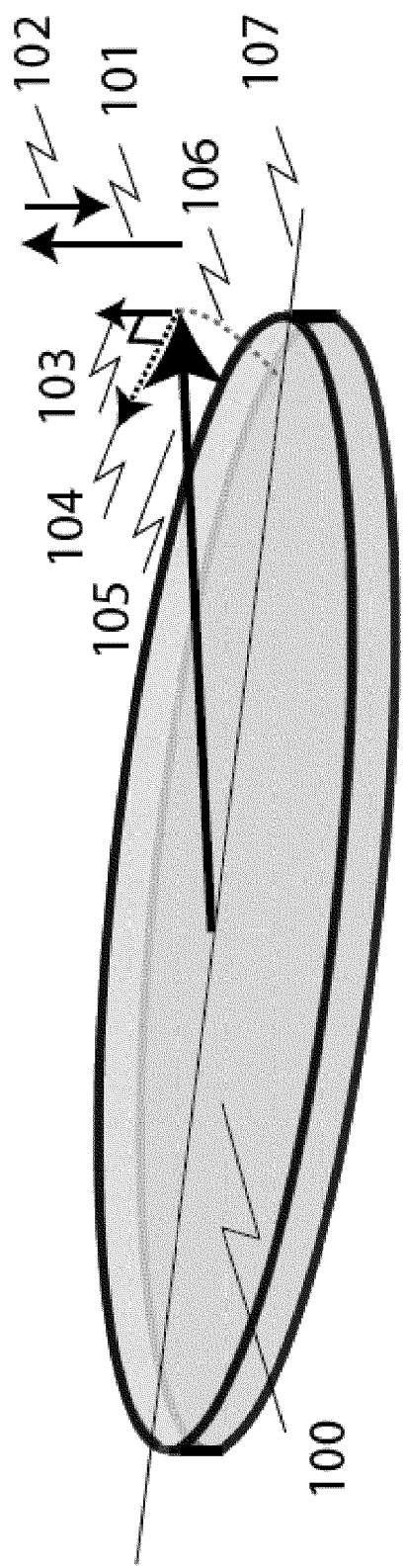

FIGS. 1A and 1B illustrate spin transfer torques acting on a free layer magnetization in accordance with an illustrative implementation. A free layer element 100 can be a thin plate or a thin film element. In FIG. 1A, the free layer element 100 is shown as an ellipse. The free layer element 100 has a magnetization vector 105. Axis 107 illustrates the easy access of the free layer element 100. In the absence of spin torques the free layer element 100 will align either pointed right or left along the axis 107. When current is applied there is a spin torque, which can be a combination of various individual spin torques. Spin torque 101 is the spin torque from a perpendicular polarizing layer. Spin torque 102 is the spin torque from the in-plane magnetized reference layer, e.g., the effective field torque. Spin torque 103 is the net spin torque perpendicular to the free layer plane. The net spin torque 103 is the combined action of torques 101 and 102. Thus, the net spin torque 103 is the vector sum of torques 101 and 102.

The torques 101 and 102 can add constructively or partially destructively. FIG. 1A illustrates torques 101 and 102 adding constructively. Accordingly, the net spin torque 103 is larger than either torque 101 or 102. FIG. 1B illustrates torques 101 and 102 adding partially destructively. That is, the net spin torque 103 in FIG. 1A is larger than the net spin torque 103 in FIG. 1B, due to how the spin torques 101 and 102 interfere with one another. FIGS. 1A and 1B also illustrate an in-plane spin-transfer torque 104 associated with the reference layer 100. This is the common spin torque that is present in devices that do not have a perpendicular polarizer. The in-plane spin-transfer torque 104 is in the plane containing the free layer 100 and a reference layer and is perpendicular to the net spin torque 103 and to the magnetization vector 105. The reference layer can act to polarize the current in a device. Then both the reference layer and the perpendicular polarizer can influence the spin-polarization and the spin torques on the free layer of a device, e.g., a bit cell, While not limiting the scope of the invention, arc 106 illustrates a trajectory that the magnetization vector 105 follows or is predicted to follow during switching. The magnetization vector 105 rotates out of the plane containing the free layer based on the spin torque 103. Rotating of the magnetization vector 105 out of this plane creates a demagnetization field about which the magnetization precesses. The spin transfer torque 104 can aid or hinder this rotation. In FIGS. 1A and 1B, the spin transfer torque aids in the rotation of magnetization and thus aids the switching of the magnetization direction.

Figure 2A:
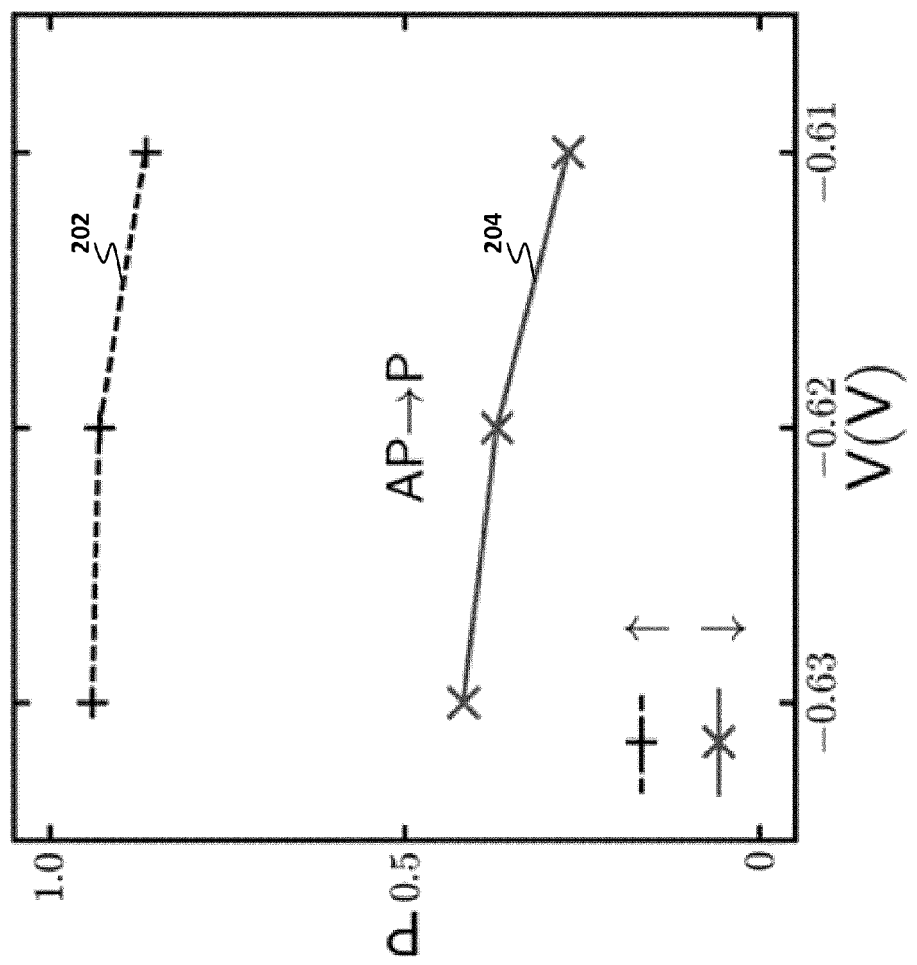
FIGS. 2A and 2B illustrates switching probabilities for constructive and destructive spin transfer torques in accordance with an illustrative implementation.
Figure 2B:
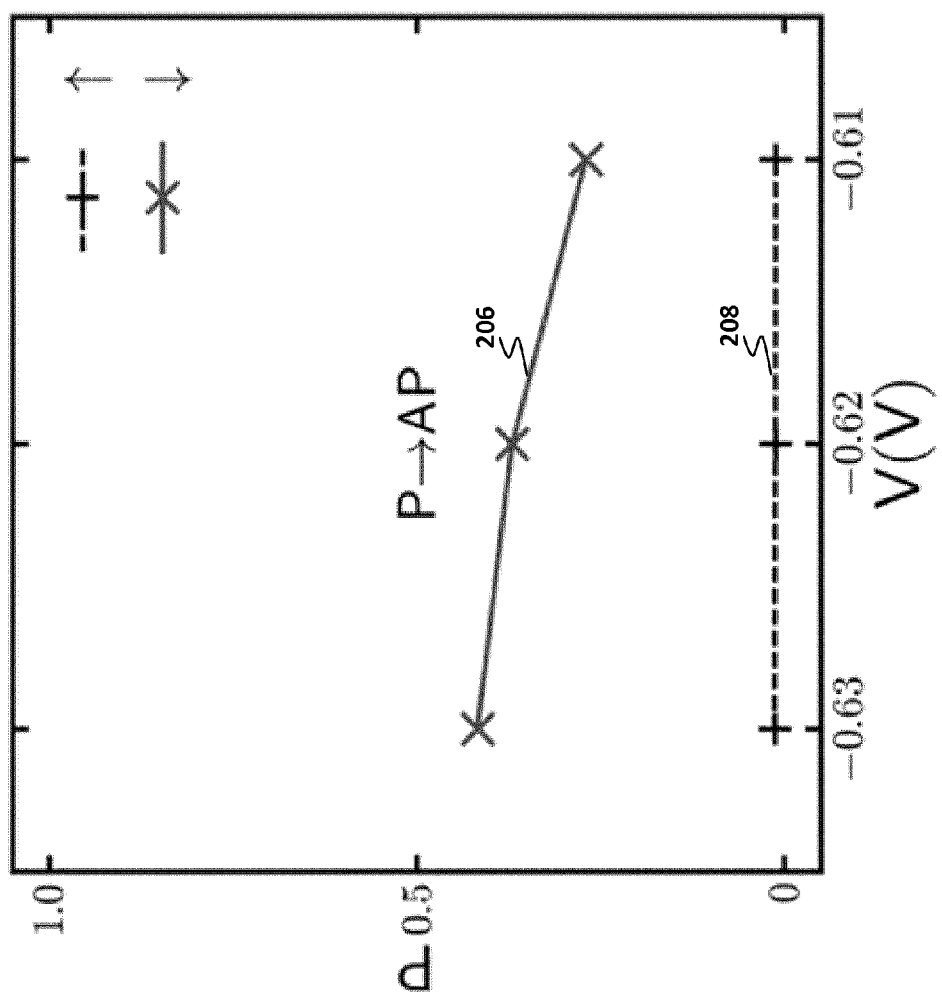

How the torques 101 and 102 interfere with one another, either constructively or partially destructively, can impact the switching from P to AP and AP to P. FIGS. 2A and 2B illustrates switching probabilities for constructive and destructive spin transfer torques in accordance with an illustrative implementation. To determine the probability of switching, measurements were made with the polarizer magnetized up and the polarizer magnetized down. In other words, measurements were made with the torques 101 and 102 constructively interfering and partially destructively interfering with one another. When the torques 101 and 102 constructively interfere, a higher switching probability results. How the torques 101 and 102 interfere with one another is dependent upon the directions of the torques 101 and 102. The direction of the torque 101 is set by the direction of the magnetization of the polarizer. Reversing the magnetization direction of the polarizer from up to down reverses the spin torque 101 associated with the polarizing layer and changes the nature of the interference. For example, in FIG. 2A the probability of switching from AP to P is greater when the polarizer is magnetized up 202 compared to when the polarizer is magnetized down 204. The torques 101 and 102 are combining constructively to increase the probability of switching from AP to P and are combining partially destructively to decrease the switching probability. The opposite, however, is true for switching from P to AP. FIG. 2B illustrates that the probability of switching from P to AP is greater when the polarizer is magnetized down 206 compared to up 208. In contrast to the AP to P switching, the torques combine constructively when the polarizer is magnetized down and therefore, the switching probability is greater when the polarizer is magnetized down.

To study the magnetization dynamics, especially the magnetization switching processes in the orthogonal spin transfer MRAM devices, time-resolved measurements can be used. Directly probing the magnetization in real time can help in understanding the switching mechanisms. Described in greater detail below are results of time-resolved electrical measurements that probe the magnetization dynamics in orthogonal spin transfer MRAM devices with nanosecond duration current pulses. From these results, different switching mechanisms for parallel (P) to anti-parallel (AP) and AP to P switching under the same pulse conditions can be theorized and shown.

Figures 3A, 3B:
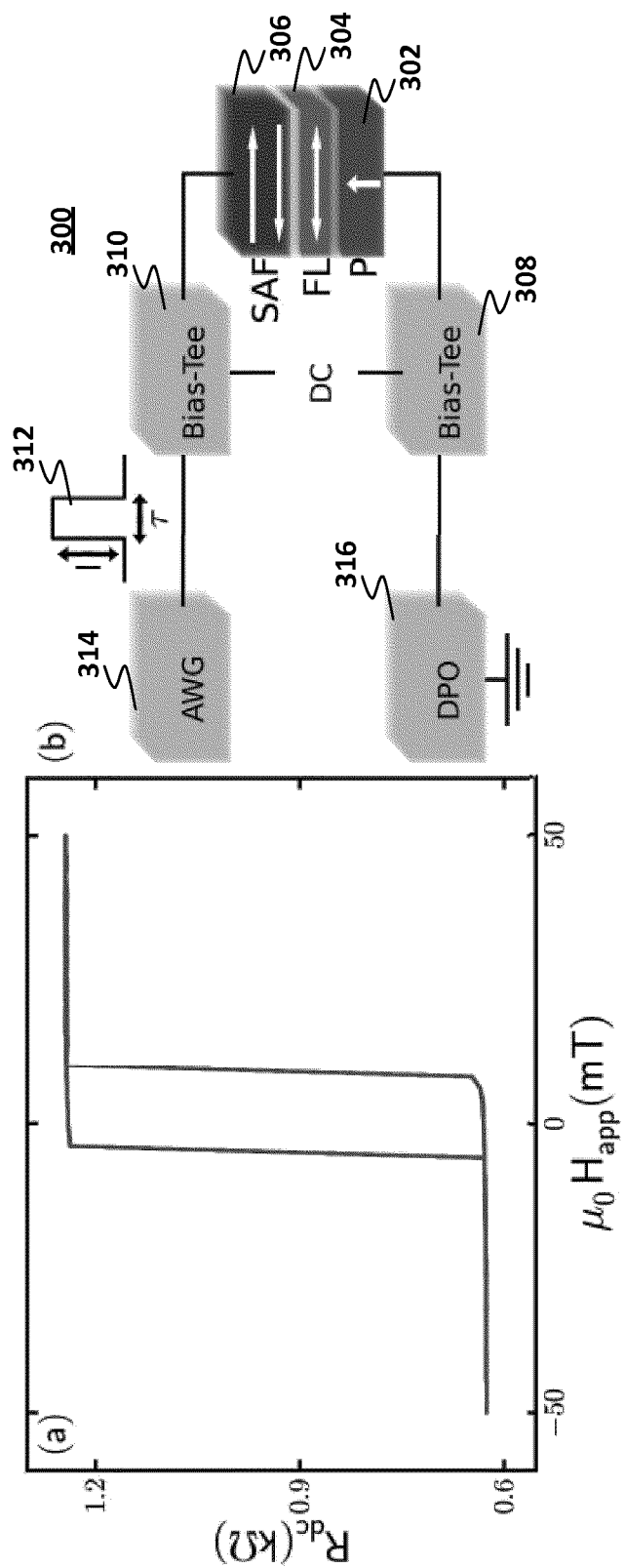
FIG. 3A is a graph of device resistance versus an in-plane field for a typical 85 nm×200 nm hexagon device at room temperature in accordance with an illustrative implementation.
FIG. 3B illustrates an experimental setup for time-resolved measurements in accordance with an illustrative implementation.

FIG. 3B illustrates an experimental setup 300 for time-resolved measurements in accordance with an illustrative implementation. The experimental setup includes an exemplary layer stack of an orthogonal spin transfer MRAM device. In one implementation, the layer stack of an orthogonal spin transfer MRAM device includes a perpendicular magnetized polarizing layer 302, an in-plane magnetized free layer 304 and a reference layer 306 that form a magnetic tunnel junction. To reduce the dipolar field acting on the free layer 304 from the reference layer 306, a synthetic antiferromagnetic (SAF) layer 306 can be employed. Based upon this structure, various devices can be made. For example, devices can be made with sizes varying from 40 nm×80 nm to 105 nm×250 nm and can be in the form of rectangles, ellipses and hexagons, virtually any useful shape. The resistance versus applied field (resistance hysteresis loops) of these devices can be measured. In various implementations, the devices can have tunneling magnetoresistance (TMR) ratios of 100% or higher and resistance area (RA) products of about 8 $\Omega\mu m^2$. FIG. 3A shows a minor resistance hysteresis loop (i.e. hysteresis in a field range in which only the device free layer switches) for an 85 nm×200 nm hexagon at room temperature. The P state resistance is 620Ω and the MR is 100%. The room temperature coercive field is 7 mT and the hysteresis loop is centered at 2 mT, as a result of a small residue coupling to the SAF.

To study the dynamics of the switching process, the experimental setup 300 illustrated in FIG. 3B can be used. The experimental setup 300 includes two bias-tees 308 and 310 used to separate the high frequency and the low frequency circuits. In the high frequency circuit, short (~ns) electrical current pulses 312 are generated by an arbitrary waveform generator (AWG) 314 and injected into the devices. During one series of measurements the rise and fall times of the pulse were about 200 ps. By putting a real-time oscilloscope, e.g., a digital phosphor oscilloscope (DPO), 316 with a 50Ω impedance in series with the device, the time variations of the current in the circuit can be measured. Since the circuit impedance is dominated by the device, the variation of the current in the circuit is proportional to the time variation of the device resistance. The latter can be determined by the relative magnetization orientations of the free and the reference layers during the pulse. The low frequency circuit can be used to measure the device resistance in equilibrium. In the time-resolved experiments, a small external magnetic field can be applied at or near the midpoint of the free layer hysteresis loop (i.e., 2 mT). Pulses can then be applied and the signals can be recorded in real time. The low frequency circuit can be used to measure the resistance of the device between the pulses, to determine whether the device has been switched by the pulse or not. The switched state of the device can be cross checked with that of the real time signals. Positive voltage can be defined as electrons flowing from the bottom to the top of the layer stack, i.e., from the polarizer toward the free and reference layers, 304 and 306, respectively.

Figure 4A:
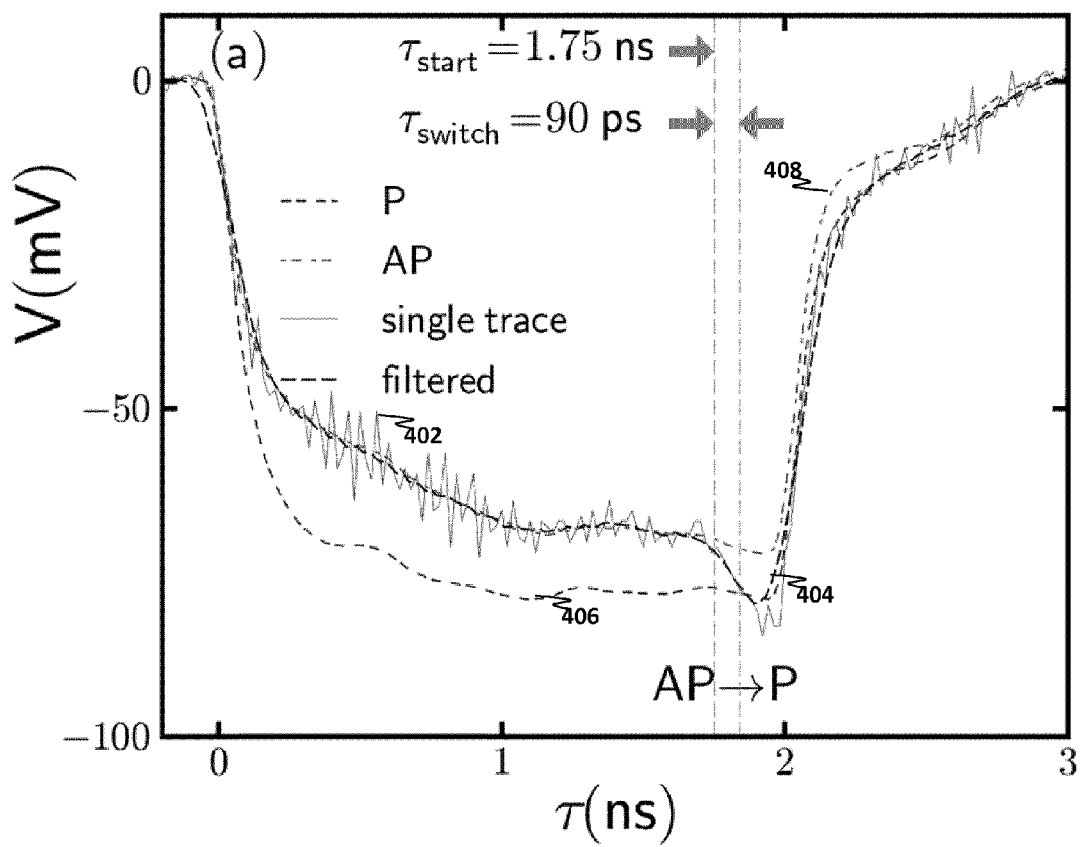
FIG. 4A. is a graph of a single-shot trace from an oscilloscope indicating the magnetization dynamics for an AP to P switching event in accordance with an illustrative implementation.
Figure 4B:
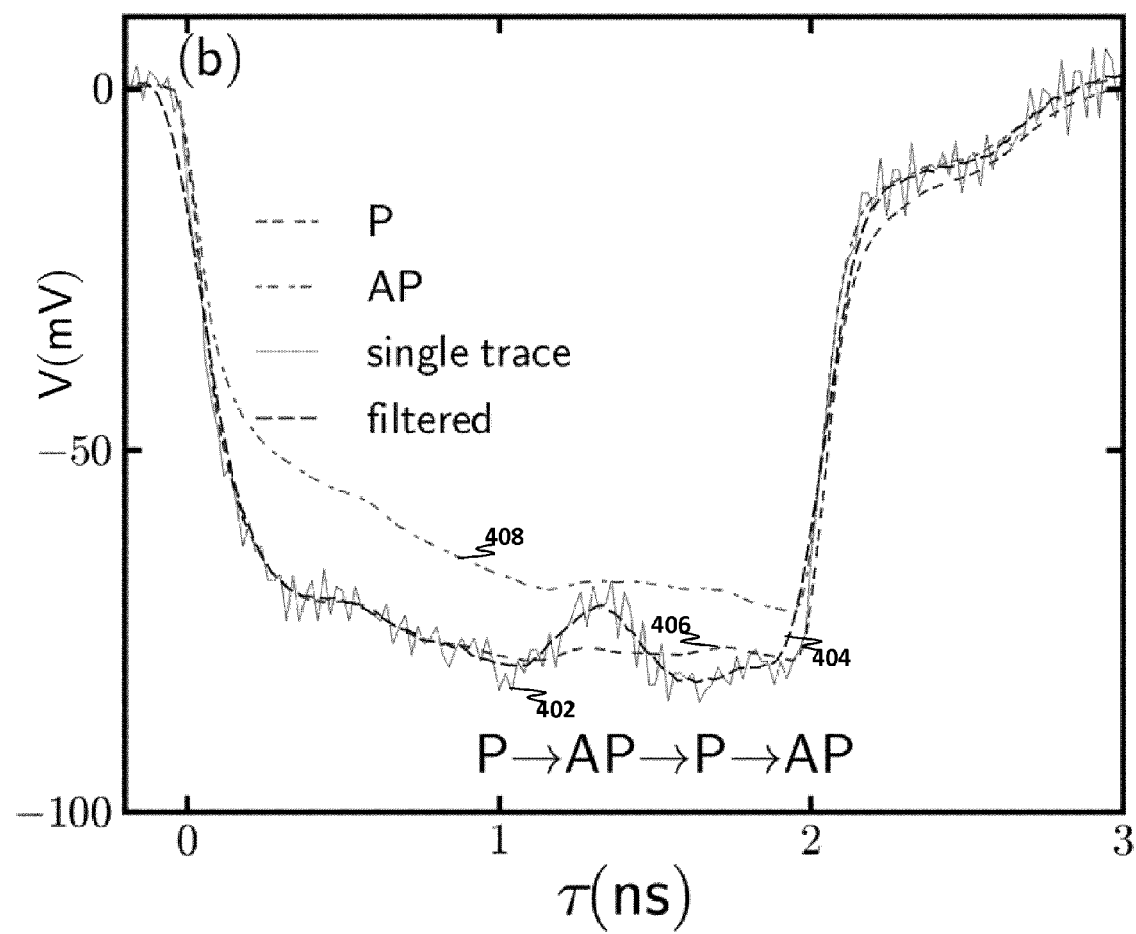
FIG. 4B. is a graph of a single-shot trace from an oscilloscope indicating the magnetization dynamics of a precessional switching event from P to AP to P then to AP in accordance with an illustrative implementation.
Figure 4C:
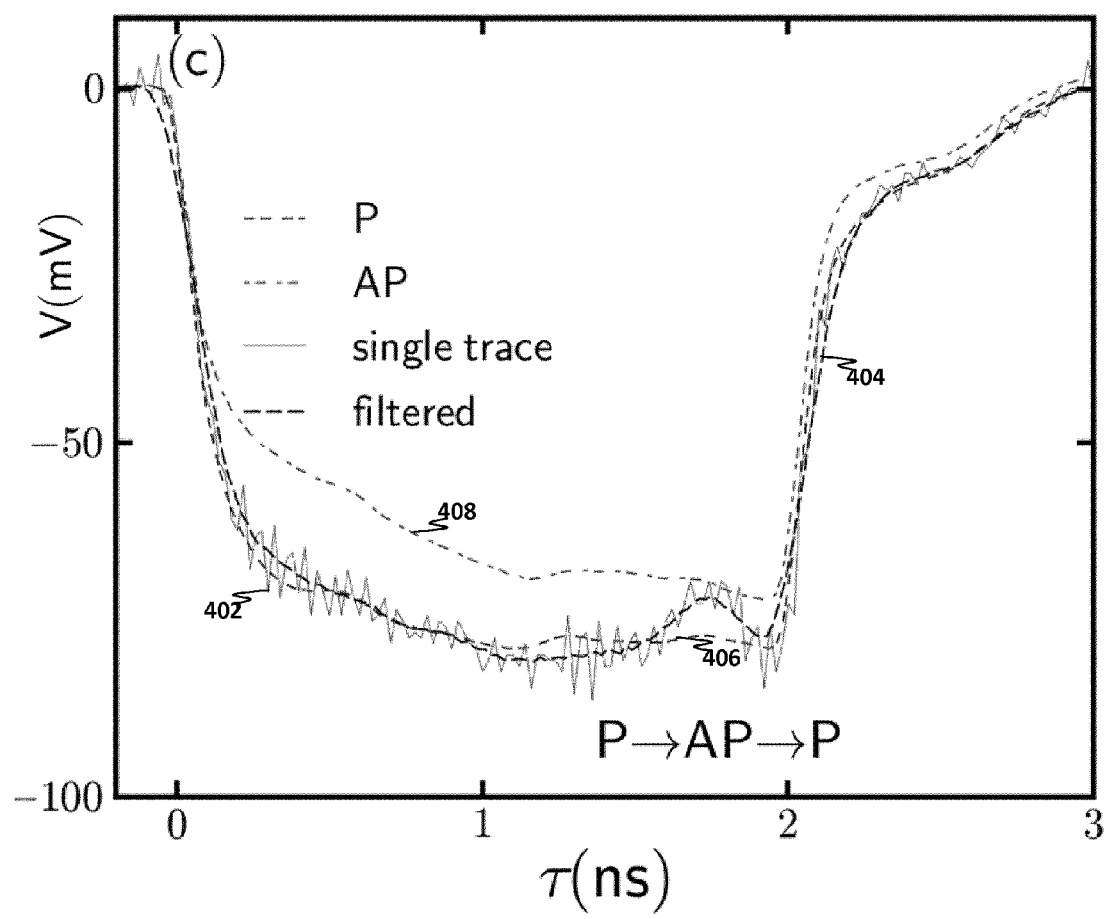
FIG. 4C. is a graph of a single-shot trace from an oscilloscope indicating the magnetization dynamics for an oscillation from P to AP then back to P in accordance with an illustrative implementation.

FIGS. 4A-4C show the single-shot traces of the voltage signal across the oscilloscope 316 for a −0.78 V, 2 ns pulse from the pulse generator 314. The initiation time for the switching can be reduced to less than 500 ps. The voltage used, however, can be such that both switching and non-switching events as well as different switching mechanisms between AP to P and P to AP for the same pulse conditions can be observed. Different voltages can be used to illustrate and utilize the differences between switching AP to P and P to AP. First curves 402 plot the raw signals from the oscilloscope for one single pulse while second curves 404 are made from smoothing the raw signals, which serve as a guide to the eye. Due to the good signal to noise ratio, the device state can be determined from the single-shot traces without averaging. For comparison, third curves 406 in all the subplots are averaged single-shot traces for the cases where the device is at the P state both before and after one pulse. Correspondingly, fourth curves 408 are the averaged "AP state" traces. For the same pulse configurations, both AP to P and P to AP switching can occur and are illustrated in FIGS. 4A-4C. FIG. 4A shows a typical AP to P switching event. In the beginning of the pulse, the signal is close to the averaged AP state trace, meaning the device is close to the AP state. Then the signal starts to deviate notably from the AP state at 1.75 ns; and the device reaches the P state 90 ps later, as shown by the vertical dashed lines. To determine the start time ($\tau_{start}$) and the transition time ($\tau_{switch}$) the single-shot voltage trace can be normalized to $V_{norm}(t)=(V(t)-V_p(t))/(V_{ap}(t)-V_p(t))$, where $V(t)$ is the single-shot voltage trace, $V_p(t)$ is the averaged voltage trace for the P state and $V_{ap}(t)$ is the averaged voltage trace for the AP state. Switching can be defined as a deviation of more than 20% from either state. In other implementations, different percentages can be used to define switching, e.g., 15%, 22%, 25%, etc.

As illustrated in FIG. 4A, an AP to P transition can require one or two nanoseconds to initiate and the transition itself is fast and direct without precession. However, a typical transition from P to AP is precessional, as shown FIG. 4B. A device initially in the P state starts to oscillate between the AP and the P state after 1.2 ns, executing two oscillation periods (P to AP to P to AP) during the pulse.

FIG. 4C shows an event where the device begins and ends in the P state. The device undergoes an oscillation from P to AP then back to P state during the pulse. The oscillation starts at 1.6 ns, which is later than that in FIG. 4B where the device eventually switches to the AP state. More than 90% of the events that start from the P state and end in the P state have notable oscillations. As a result, the third curves 406, which are the average traces of all the start-and-end-in-P events, have a higher (negative) voltage than the true P state for $\tau \geq 1$ ns. Therefore, in all three subplots, the single shot trace slightly crosses the averaged P state curve.

Determining the end state of the device from single-shot traces can be difficult, as during the falling edge of the pulse, the signals of the P and the AP states and their differences become smaller. In addition, the magnetic dynamics may not stop right at the end of the pulse. To account for this, the device state can be independently determined after each pulse by a direct current resistance measurement.

FIGS. 5A and 5B show the distribution of $\tau_{start}$ and $\tau_{switch}$ for about 10,000 switching events. For negative voltage, the STT from the reference layer favors the P state. As a result, the AP to P switching has a higher probability (44%) than that of the P to AP switching (23%). As shown in FIG. 5A (the upper figure panel labeled (a)), for AP to P transitions, most $\tau_{start}$ values are between 1 and 2.4 ns; and switching events are more likely to occur later in the pulse. However, most of the transitions are very fast, occurring within 200 ps, as shown in FIG. 5B (the upper figure panel labeled (b)), which corresponds to a direct AP to P transition.

For P to AP switching, the start time peaks around 1.4 ns as shown in FIG. 5A (the lower figure panel labeled (c)), 500 ps earlier than that for AP to P switching. While the distributions for AP to P switching are unimodal, P to AP switching has a very pronounced bimodal distribution: some transitions take less than 200 ps while most transitions take around 800 ps. FIG. 5B (the lower figure panel labeled (d)) also shows a minimal number of switching events for transitions that take about 400 ps.

Figures 6A, 6B:
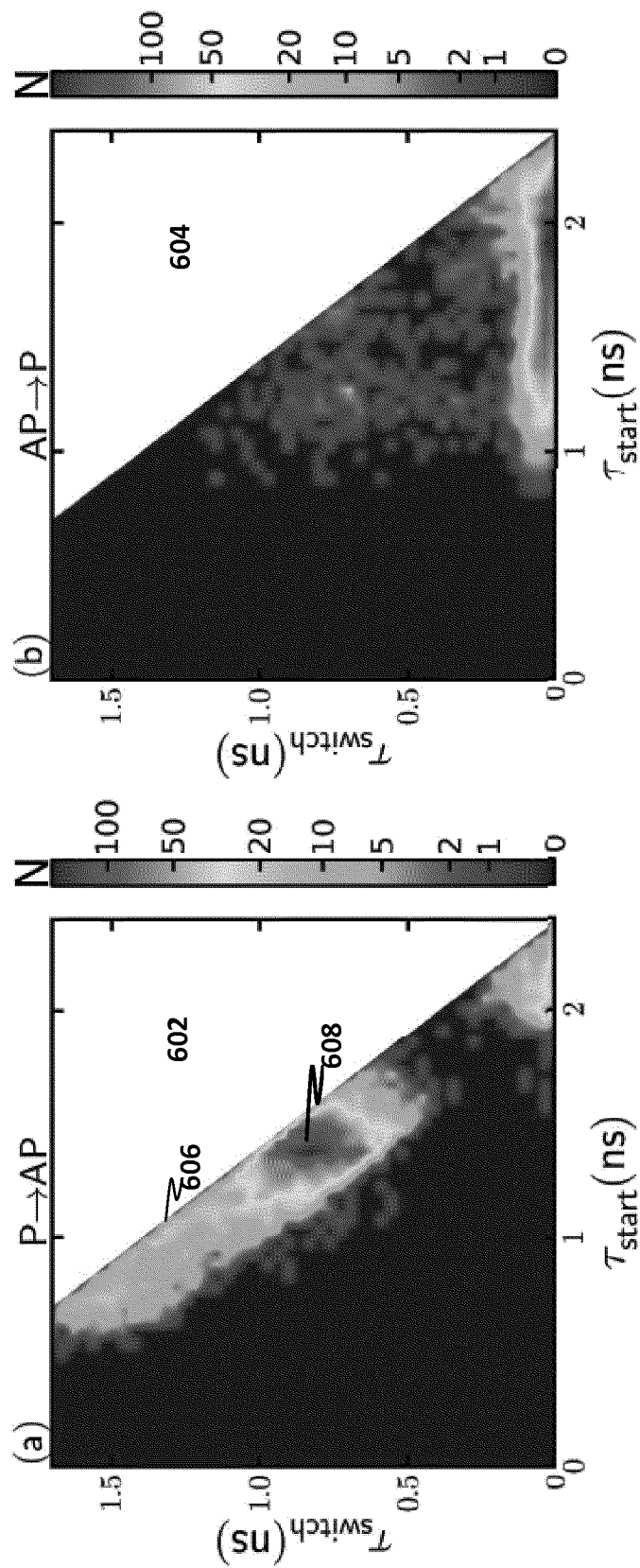
FIG. 6A illustrates the correlation between $\tau_{start}$ and $\tau_{switch}$ for P to AP switching in accordance with an illustrative implementation.
FIG. 6B illustrates the correlation between $\tau_{start}$ and $\tau_{switch}$ for AP to P switching in accordance with an illustrative implementation.

The correlation between $\tau_{start}$ and $\tau_{switch}$ is shown in FIG. 6A for P to AP switching and in FIG. 6B for AP to P switching. Both the x axis ($\tau_{start}$) and the y axis ($\tau_{switch}$) are divided evenly into a 500 by 500 grid, with the scale representing the number of switching events within of the grid's cells. The white regions 602 and 604 represent the limit of the pulse configuration since $\tau_{start}+\tau_{switch}$ must be less than the pulse duration plus the fall time (about 2.4 ns), the time window in which the signal can be resolved. For P to AP switching, as shown in FIG. 6A, almost all of the switching events are along this boundary 606, i.e. 2 ns<$\tau_{start}+\tau_{switch}$<2.4 ns. This means the magnetization dynamics, once started, last until the end of the pulse. In the absence of thermal fluctuations, $\tau_{start}+\tau_{switch}$ can be equal to the pulse duration plus the fall time. Since the illustrated experiments were conducted at room temperature, this boundary is broadened by thermal fluctuations and occurs between 2 and 2.4 ns. Most P to AP switching events are centered at $\tau_{start}$=1.4 ns and $\tau_{switch}$=0.8 ns, as indicated by the region 608 in the center of this plot. This corresponds to multiple oscillations between the P and AP states (P→AP→P→AP), as occurred in the event shown in FIG. 4B. Also there are very few switching events with 0.3 ns<$\tau_{switch}$<0.4 ns and 1.7 ns<$\tau_{start}$<1.8 ns. The absence of P to AP events in these time windows corresponds to the magnetization executing a full precessional cycle (P→AP→P), like the event shown in FIG. 4C. FIG. 6A demonstrates that the P to AP switching is precessional. Due to the pulse duration and the period of the oscillation, only oscillations starting in certain ranges of time lead to switching.

The AP to P switching mechanism dynamic is different from that of P to AP switching. For AP to P switching, as shown in FIG. 6B, most start times are between 1 and 2.4 ns. Further, they are typically less than 200 ps, faster than half of the oscillation period for the P to AP switching. Therefore the typical AP to P switching corresponds to the direct transition, similar to the event shown in FIG. 4A.

The direct transition between AP to P, yet precessional reversal for most P to AP switching under the same pulse configuration, can be explained by the torques acting perpendicular to the free layer plane. For a device initially in the AP state for the same pulse amplitude the current is smaller, since the device has a larger resistance in the AP than in the P state. Therefore, at the beginning of the pulse the STT from the polarizing layer will be smaller and perpendicular torque will not be sufficient to tilt the free layer magnetization out of plane far enough to cause the magnetization to precess. As a result, the switching process is similar to that of a traditional collinear device where the STT from the reference layer, which favors the P state, contributes to the switching process. The transition is then fast and direct with a relatively long initiation time. For a device initially in the P state, the current and therefore the perpendicular torque is large enough to initiate precession and once started is able to keep the precession going until the end of the pulse. The start time is also less than that for events that start in the AP state. Depending on the start time, the device will be closer to the P or to the AP state at the end of the pulse.

As described above, time-resolved measurements were made to study the magnetization dynamics in orthogonal spin transfer MRAM devices. The P and AP states and the transition between these two states during the pulse from single-shot signal traces can be identified. The main switching processes are quite distinct, even for the same pulse parameters. For AP to P switching, the device typically makes a direct transition within 200 ps. For P to AP switching, the reversal is precessional. It is believed that the different switching processes can be explained by the strength of the out-of-plane torque, which depends on the pulse current through the device and is initially larger for a device starting in the P state than one starting in the AP state. These results demonstrate the strong influence of the spin torques acting perpendicular to the plane of the free layer to the switching processes and provide new possibilities to control and optimize device operation.

As described above, there can be an effect of spin torques from both the perpendicular polarizer and an in-plane magnetized reference layer that act on the switchable magnetic layer (or equivalently the free magnetic layer) that can combine constructively or destructively.

When the spin torques combine constructively, they can improve the device performance as a memory cell (e.g. such as lowering the power required, switching current and the switching time). However, when they combine destructively, they have the opposite effect, increasing the required switching current and rendering devices less susceptible to current induced magnetic instabilities and switching. Destructive interference can be used in various applications. For example, it can provide a write-once memory, useful in security devices, also known as fusible bits, which are bits that cannot be rewritten. The destructive interference can also be useful for magnetic sensors. In a sensor, a high current or voltage is applied and spin-torque excitations and switching are not desirable. The destructive interference reduces the spin-torque on the sensing (i.e. free) magnetic layer and thus the magnetic noise.

The two spin-torques that combine constructively or destructively are the spin torque from the in-plane magnetized reference layer in the orthogonal spin transfer MRAM stack, known as a field-like torque, and the spin-torque from the perpendicular polarizer. The field-like torque is perpendicular to the plane containing the magnetization vectors of the free and reference layer magnetizations. It is mathematically described as the vector cross product of the magnetization directions of the free and reference layers. As the free layer magnetization is in or close to the plane containing this layer and the reference layer magnetization is in or close to the plane containing the reference layer, this torque is mainly perpendicular to the free layer plane. This torque is important in magnetic tunnel junctions, and associated with the junction between the reference and the free layer (i.e. the two magnetic layers separated by a thin insulating layer.) The spin-torque from the perpendicular polarizer is the direction of the magnetization of the perpendicular polarizer. It is therefore perpendicular to the plane of the free layer.

How these torques combine depends upon the sign of current in the device and the direction of the magnetization vector of the perpendicularly magnetized polarizer. The latter can be magnetized up or down along an axis perpendicular to the layer plane. It can also be switched from up to down with a current or with an applied magnetic field.

The field-like torque depends on the material comprising the magnetic tunnel junction. It also depends on the device geometry (i.e. the shape of the magnetic layers). For tunnel junctions in which both the free and reference layer (the layers adjacent to the tunnel barrier) are of the same composition, the direction of this torque is largely independent of the sign of the applied current. This corresponds to an effective field from the reference layer, whose strength depends on the magnitude of the current, but whose sign is largely independent of the polarity of the current. This field-like spin-torque can then be said to be an even function of the applied current. When the layers that comprise the magnetic tunnel junction are not the same (they may differ in compositions, materials or structure), then the direction of the field-like torque depends on the sign of the current, and the field-like spin-torque can be said to be an odd function of the applied current (or to have a component which is odd—e.g. a general function can be decomposed into its odd and even components).

Thus, the materials that comprise the reference and the free layers offer a means to engineer the spin-torques for applications. For example, a field-like torque that changes sign with the sign of the current can offer a device with suppressed magnetic noise for both current polarities. On the other hand, it can also offer a magnetic memory device that operates more effectively, with constructive interference of the two spin torques for both signs (polarities) of the current. A device with an even effective field torque offers constructive interference of the spin-torques for one current polarity and destructive interference of the spin-torques for opposite current polarity.

In one implementation, constructive interference can be used in an orthogonal spin transfer MRAM bit cell. The use of constructive interference can improve the bit cell performance by lowering the switching current; increasing the switching speed (reducing the time it takes to write); and/or decreasing the energy required to operate the device. The spin torques from the polarizer and the reference layer are engineered to be constructive for both current polarities. This requires that the effective field torque be predominantly an odd function of the current or, equivalently, the voltage polarity. In this case, for both current (and voltage) polarities a current pulse induces spin precession that can switch the device. The spin-transfer torque from the reference layer will also lead to a polarity dependent spin-transfer torque where the polarity of the current can determine the final free layer magnetization that is favored (and thus the bit state, 0 or 1). This can be used because the constructive interference produces direct, fast (<200 ps) transitions between magnetic states that have a high probability of reaching the desired bit state after the pulse, i.e. very small bit error rates.

In another implementation there can be constructive interference, but only for one current or voltage polarity. Interference between the effective field torque from the reference layer and the spin-transfer torque from the polarizer layer can be designed to be constructive for only one current or voltage polarity. This can be done when the effective field torque be predominantly an even function of the current or, equivalently, the voltage polarity.

This makes possible a new type of write once memory. The memory can only be written once but read infinitely many times. Applications are for fusible bits, e.g. in security devices. The memory could be used in electronic cash systems, each time you pay for something the memory cells are overwritten by the amount deducted and then cannot be rewritten.

An example is a device in which the free layer can only be switched from a P to AP state, say with a positive polarity pulse, and not from an AP to P state (with either polarity pulses). The memory can be initialized in the P state (globally, for example, with an external applied magnetic field). Positive polarity current pulses can then be applied to write selected (individual) bit cells from P to AP. The writing may represent the use of electronic cash, as the user cannot reset the device back to the initial all bit cells P state. To prevent a user from re-initializing the memory (e.g. recreating the P state), the memory can be encapsulated in a material that shields the bit cells from magnetic fields, such as mu-metal, after the initial memory state is established. Alternatively, magnetic sensors can be incorporated into the memory chip to monitor whether the chip has been tampered with. Logic in the chip can deactivate or destroy a memory chip that has been exposed to magnetic fields capable of re-initializing or otherwise changing a memory state.

Orthogonal spin transfer MRAM bit cells can be configured in various ways. For example, orthogonal spin transfer MRAM bit cells can be resettable (with different current/voltage parameters or an external field for writing and resetting), or permanent; designed so that it is not possible to restore the memory system to its initial state.

The resettable memory cell can be re-loaded (e.g. for cash cards); the permanent type cannot be reprogrammed. In various implementations, the resettable memory cell can be used for secure counters, e.g., in smart cards. Another benefit for security applications is that the device cannot easily be reverse-engineered using conventional microprobing techniques.

In another implementation, constructive interference for one magnetization state of the perpendicular polarizer and destructive interference for the oppositely magnetized state of the perpendicular polarizer can be used. This is a variant of using constructive interference described above. If the interference is constructive for one magnetization state of the perpendicular polarizer for both current and voltage polarities, it will be at least partially destructive for both current and voltage polarities if the magnetization of the perpendicular polarizer is reversed (say, realigned from magnetized up to magnetized down.) It is then possible to reverse the magnetization of the polarizer or a set of polarizers in a memory array and those cells will no longer be able to be rewritten. That is, they will be inaccessible.

A local field, from a nearby current carrying wire, could be used to change the state of the perpendicularly magnetized polarizer. It is also possible that the state of the polarizer could be changed using current induced switching. A second perpendicular magnetized layer can provide the spin torque to change the state of the perpendicularly magnetized layer.

As an example of this implementation, the ability for memory to be written can be changed to a write-protected memory. The memory could hold the contents of a program that is loaded once but then must not be rewritten. By flipping the polarizer, the cells could no longer be rewritten. This can be used for security applications (virus protection, entire memory pages of a computer can be hardware protected against writing.)

As another example, the memory can be used as reprogrammable logic, e.g. for a spin-transfer or field programmable gate array (FPGA). The logic can only reprogrammed for a particular magnetic state of the polarizing layer.

In another implementation, a logic device can include a switchable spin-torque memory. The logic device can use a switchable perpendicular polarizer that has multiple (at least two) stable configurations. By changing the polarizer configuration, the action of the polarizer can be changed to produce largely constructive or destructive interference of the spin torques. This type of device combines logic and memory and can act as a reprogrammable logic device. The desired logic function is programmed by setting the polarizer state.

As an example, a logic device can act as a NAND gate (any logic function can be realize using NAND gates, i.e., it is a universal gate). Inputs are: perpendicular polarizer state and in-plane reference layer states. The output can be a switching event (or not switching event) for pulsed operation or resistance change or no resistance change for DC operation. In one implementation, the state of the free layer can only be changed if both polarizers produce spin torques that combine constructively. The same device can be used to create an XOR function.

The device could be realized either as a two-terminal or a multi-terminal device. In a two-terminal device, the polarizer could be selectively switched by applying an external field or by applying an appropriate current pulse sequence. In a multi-terminal device, current can be applied selectively to the individual layers. For example, an electrical contact to a non-magnetic metallic layer between the perpendicular polarizer and the free layer would enable applying a current selectively to the perpendicular polarizer. If the device consisted of two perpendicularly magnetized layers separated by a non-magnetic layer (i.e. a composite perpendicularly polarizer) then this current could be used to change the magnetic state of one of the two perpendicularly magnetized layers. This layer could be the one in closer proximity to the free layer and changing its state would change the spin-torques acting on the free layer.

A combined memory-logic cell can be used in various ways. For example, the combined memory-logic cell can be used as switching write-protected memory. Under normal operation, the combined memory-logic cell can act like an orthogonal spin transfer MRAM cell. By flipping the polarizer the cell does not switch any more, and therefore the cell acts like write-protected memory and not a traditional orthogonal spin transfer MRAM cell. This can be used for security applications: virus protection, and entire memory pages of a computer can be hardware protected against writing. This also makes buffer overflow attacks impossible. The combined memory-logic cell can also be used as reprogrammable logic, e.g., for a field programmable gate array (FPGA).

In yet another implementation, the combined spin torques can be used in a magnetic sensor with reduced spin torque magnetic noise. Destructive interference of the spin torques can be used to produce a magnetic sensor with reduced magnetic noise associated with spin torque. A high current can be passed through this device without causing switching or excitation of the free sensing magnetic layer. A higher current makes it possible to increase the sensor's signal-to noise ratio. In traditional sensors, high currents can create noise in the sensors.

Such a magnetic sensor could be used in magnetic recording, magnetic field mapping, navigation (e.g. an electronic compass), and magnetic bead detection in microfluidic channels or biochips. Other examples include using a sensor as part of a magnetic recording device, e.g., a hard drive, a compass in a mobile device, or as part of an air bag deployment system.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated in a single software product or packaged into multiple software products.

Thus, particular implementations of the invention have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An orthogonal spin-torque bit cell, comprising:
a perpendicular magnetized polarizing layer having a magnetic vector, wherein the perpendicular magnetized polarizing layer provides a first spin-torque;
an in-plane magnetized free layer;
an element used to change the magnetic vector of the perpendicular magnetized polarizing layer to be magnetized up or down along an axis perpendicular to a plane of the perpendicular magnetized polarizing layer; and
a reference layer that provides a second spin-torque, wherein the first spin-torque and the second spin-torque combine, wherein the magnetic vector of the perpendicular magnetized polarizing layer affects combination of the first spin-torque and the second spin-torque, wherein the in-plane magnetized free layer and the reference layer form a magnetic tunnel junction, and wherein the combined first spin-torque and second spin-torque influences the magnetic state of the in-plane magnetized free layer.

2. The orthogonal spin-torque bit cell of claim 1, wherein the first spin-torque and the second spin-torque constructively combine based upon the magnetic vector of the perpendicular magnetized polarizing layer.

3. The orthogonal spin-torque bit cell of claim 1, wherein the first spin-torque and the second spin-torque destructively combine based upon the magnetic vector of the perpendicular magnetized polarizing layer.

4. The orthogonal spin-torque bit cell of claim 2, wherein the constructively combined first spin-torque and second spin-torque lowers a switching current of the orthogonal spin-torque bit cell.

5. The orthogonal spin-torque bit cell of claim 2, wherein the constructively combined first spin-torque and second spin-torque increases a switching speed of the orthogonal spin-torque bit cell.

6. The orthogonal spin-torque bit cell of claim 2, wherein the constructively combined first spin-torque and second spin-torque decreases an operating energy of the orthogonal spin-torque bit cell.

7. A logic component, comprising:
a perpendicular magnetized polarizing layer having a magnetic vector and two or more stable configurations, wherein the perpendicular magnetized polarizing layer that provides a first spin-torque based upon an active configuration;
an in-plane magnetized free layer;
an element used to change the magnetic vector of the perpendicular magnetized polarizing layer to be magnetized up or down along an axis perpendicular to a plane of the perpendicular magnetized polarizing layer; and
a reference layer that provides a second spin-torque, wherein the first spin-torque and the second spin-torque combine, wherein the magnetic vector of the perpendicular magnetized polarizing layer affects combination of the first spin-torque and the second spin-torque, wherein the in-plane magnetized free layer and the reference layer form a magnetic tunnel junction, and wherein the combined first spin-torque and second spin-torque influences the magnetic state of the in-plane magnetized free layer.

8. The logic component of claim 7, wherein the logic component is a NAND gate.

9. The orthogonal spin-torque bit cell of claim 1, wherein the element used to change the magnetic vector of the perpendicular magnetized polarizing layer is a wire used to carry a current used to change the magnetic vector.

10. The orthogonal spin-torque bit cell of claim 1, wherein the element used to change the magnetic vector of the perpendicular magnetized polarizing layer comprises a second perpendicular magnetized layer used to provide a spin torque to change the magnetic vector.

11. The orthogonal spin-torque bit cell of claim 1, further comprising a current source connected to the perpendicular magnetized polarizing layer and the reference layer used to provide a current to change the magnetic state of the in-plane magnetized free layer.

12. The orthogonal spin-torque bit cell of claim 1, wherein the combination of the first spin-torque and the second spin-torque is destructive based upon the magnetic vector of the perpendicular magnetized polarizing layer being in a first direction, and wherein the combination of the first spin-torque and the second spin-torque is constructive based upon the magnetic vector of the perpendicular magnetized polarizing layer being in a second direction opposite the first direction.

13. The logic component of claim 7, wherein the first spin-torque and the second spin-torque destructively combine based upon the magnetic vector of the perpendicular magnetized polarizing layer.

14. The logic component of claim 7, wherein the constructively combined first spin-torque and second spin-torque lowers a switching current of the orthogonal spin-torque bit cell.

15. The logic component of claim 14, wherein the constructively combined first spin-torque and second spin-torque increases a switching speed of the orthogonal spin-torque bit cell.

16. The logic component of claim 14, wherein the constructively combined first spin-torque and second spin-torque decreases an operating energy of the orthogonal spin-torque bit cell.

17. The logic component of claim 7, wherein the element used to change the magnetic vector of the perpendicular magnetized polarizing layer is a wire used to carry a current used to change the magnetic vector.

18. The logic component of claim 7, wherein the element used to change the magnetic vector of the perpendicular magnetized polarizing layer comprises a second perpendicular magnetized layer used to provide a spin torque to change the magnetic vector.

19. The logic component of claim 7, further comprising three terminals, wherein one terminal is connected to the element used to change the magnetic vector of the perpendicular magnetized polarizing layer.

20. The logic component of claim 7, wherein the combination of the first spin-torque and the second spin-torque is destructive based upon the magnetic vector of the perpendicular magnetized polarizing layer being in a first direction, and wherein the combination of the first spin-torque and the second spin-torque is constructive based upon the magnetic vector of the perpendicular magnetized polarizing layer being in a second direction opposite the first direction.

* * * * *